Dec. 20, 1966 W. GANTER ET AL 3,293,568

AMPLITUDE STABILIZED ELECTROMECHANICAL OSCILLATOR

Filed Feb. 12, 1964 3 Sheets-Sheet 1

INVENTORS
W. Ganter
G. Glaser
BY
Watson, Cole, Grindle & Watson
Attys.

Dec. 20, 1966 W. GANTER ETAL 3,293,568
AMPLITUDE STABILIZED ELECTROMECHANICAL OSCILLATOR
Filed Feb. 12, 1964 3 Sheets-Sheet 2

INVENTORS
W. Ganter
BY G. Glaser
Watson, Cole, Grindle & Watson
Attys.

AMPLITUDE STABILIZED ELECTROMECHANICAL OSCILLATOR

Filed Feb. 12, 1964 3 Sheets-Sheet 3

INVENTORS
W. Ganter
BY G. Glaser
Watson, Cole, Grindle & Watson
Attys.

United States Patent Office 3,293,568

Patented Dec. 20, 1966

3,293,568

AMPLITUDE STABILIZED ELECTRO-MECHANICAL OSCILLATOR

Wolfgang Ganter and Günther Glaser, Schramberg, Wurttemberg, Germany, assignors to Gebruder Junghans Aktiengesellschaft, Schramberg, Wurttemberg, Germany, a corporation of Germany Filed Feb. 12, 1964, Ser. No. 344,397
Claims priority, application Germany, Feb. 20, 1963, J 23,215
3 Claims. (Cl. 331—109)

The invention relates to a circuit arrangement for an electrically driven mechanical oscillating element such as a balance wheel of a time-keeping instrument, preferably a clock or watch, with at least one semiconductor amplifier, preferably a transistor amplifier, which is controlled by a voltage produced by the relative movement between a magnet system and a control coil and supplying on the output side current pulses flowing through a driving coil exerting a driving effect on the oscillating element.

In circuit arrangements of the above type used in connection with semiconductor amplifiers a stabilization of the amplitude of oscillation of the time-keeping oscillating element is important because the pulses supplied by the semiconductor amplifier are dependent upon the surrounding conditions, especially the temperature. It is already known to use for the stabilization of the amplitude of an oscillating element carrying a permanent magnet system an eddy-current brake which is influenced by the permanent magnet system as soon as the oscillating element exceeds a certain amplitude. The oscillating element is in this case braked by the eddy-currents and thereby returned to the desired amplitude of oscillation. This stabilizing arrangement does not however act efficiently. An objection is also that the surplus driving energy supplied to the oscillating element is destroyed completely. This means an additional load on the source of driving current.

The invention has for its object to produce a circuit arrangement of the type mentioned at the outset, with which a much more effective stabilization of the amplitude of oscillation is possible in a very large range of voltage with slight loss of power. The invention is characterized in that a resistance controlled by the amplitude of the oscillation is connected up in parallel with the control coil of the semiconductor amplifier. A transistor controlled by the regulating coil, preferably a silicon transistor, is preferably used as controllable resistance. A diode connected in parallel with the control coil with the steepest possible drop of forward resistance above a voltage which is greater than the input threshold value of the transistor can also be used as controllable resistance. The arrangement according to the invention possesses the advantage over the known arrangements that, in the case of high supply voltage, the driving energy is reduced. On the other hand, the known arrangements are open to the objection that a portion of energy is destroyed in the case of constant driving energy.

Several embodiments of the invention are hereinafter described by way of example with reference to the accompanying drawings, in which.

Figure 1:
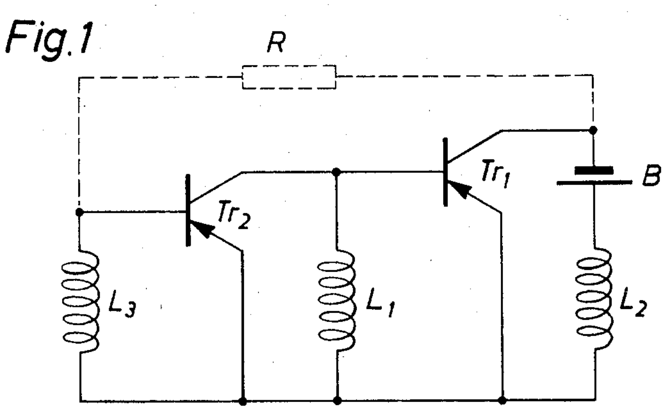
FIG. 1 is the first example of a circuit arrangement according to the invention.
Figure 2:
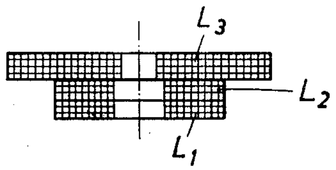
FIG. 2 is a longitudinal section of the coil arrangement of the example shown in FIG. 1.

In FIG. 1 the main transistor designated by T*r*1 controls the current supplied by the battery B and flowing through the driving coil L2. In the input circuit of the transistor T*r*1 is connected a control coil L1 to which a series resistance and/or a parallel resistance can be added to set the amplitude. The emitter-collector section of the regulating transistor T*r*2, which includes the regulating coil L3 in the input circuit, is in parallel with the control coil L1. In this circuit arrangement, the variation in temperature of the transistor T*r*1 is compensated by that of the transistor T*r*2. An over-compensation can even occur, for which reason a silicon transistor is preferably used as regulating transistor and a germanium transistor as main transistor. The variation in temperature of T*r*2 should be considerably smaller than that of T*r*1. Any remaining temperature variation can be compensated by resistances dependant upon temperature or even by suitably constructing the coils L1 and L3. If, for example, the T*r*2 temperature variation is not sufficient in the case of a given coil diameter to compensate the temperature variation of T*r*1, an improvement can be attained by enlargement of the ratios $D_{L3}:D_{L1}$ and $d_{L1}:d_{L3}$ (FIG. 2); D being the external diameter and *d* the internal diameter of the respective coils. The compensation is therefore improved by the fact that the regulating coil is wider than the control coil. This can be carried through until over-compensation is reached.

In principle it must be seen that the two transistors have the same temperatures, which should always be the case under normal working conditions (practically no self-heating takes place). In the event of a clock case being heated locally, it is possible to embed the two transistors in a material having high conductivity. R designates a resistance which can connect the negative pole of the battery B with the base of the regulating transistor T*r*2. When this resistance R is used, the regulating coil L3 can be omitted. In this case the regulating transistor T*r*2 will be controlled by the voltage of the battery.

The circuit stage (L1, L2, T*r*1, B in FIG. 1) supplying the driving impulses for the oscillating element, is so laid out that the best possible self-starting is ensured and that the energy fed to the oscillating element is so great that the amplitude of oscillation of the oscillating element is too large without any regulation. The regulating transistor T*r*2 should only be made conductive by the voltage generated in the regulating coil L3 when the normal amplitude is almost reached. This can be attained by suitably constructing the regulating coil L3.

Figure 4:
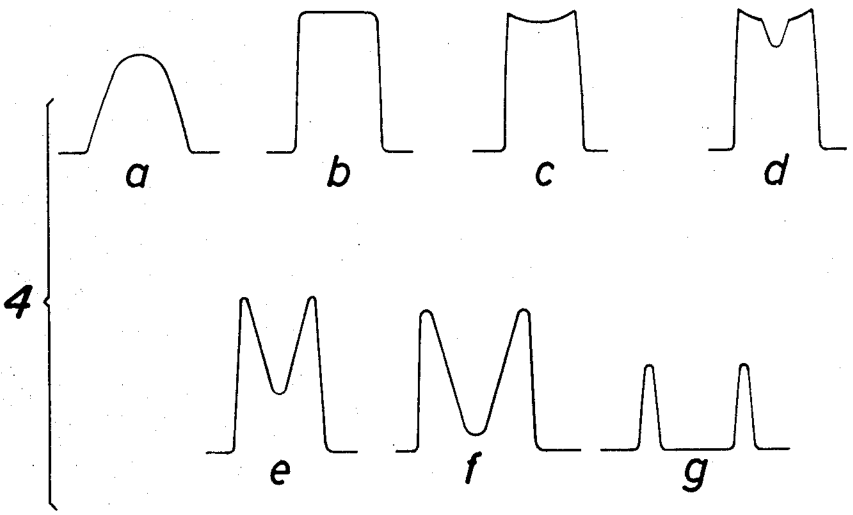
FIG. 4 shows in waveforms *a* through *g* the current pulses influencing the driving coil in the case of different amplitudes of the oscillating element.

The circuit arrangement illustrated in FIG. 1 operates in the following manner:

In the case of small amplitudes of the oscillating element (not shown) the control voltage of the main transistor T*r*1 will be less than full amplitude. In FIG. 4*a*, for example, a current impulse occurring in the driving coil L2 in the case of an oscillation amplitude of about 90° is shown. In the case of an oscillation amplitude of about 180° (FIG. 4*b*) the main transistor T*r*1 is already completely conductive. In the case of an oscillation amplitude of about 240° (FIG. 4*c*) the counter electromotive force induced by the oscillating element in the driving coil is clearly visible.

From an amplitude of about 250° (FIG. 4*d*) onwards the regulating transistor T*r*2 is conducting more and more. The control coil L1 is therefore short-circuited more and more so that a portion of the control current produced in it flows over the regulating transistor T*r*2. FIG. 4*e* shows the impulse current occurring in the case of an amplitude of about 260°. In the case of an oscillation amplitude of about 290° (FIG. 4*f*) the normal amplitude of the oscillating element is reached. If the amplitude of oscillation is increased to 320° (FIG. 4*g*) the current impulses will become smaller so that the energy supplied to the oscillatory element is no longer sufficient to maintain this amplitude. Therefore the amplitude again returns to its normal value of 290°.

Figure 3:
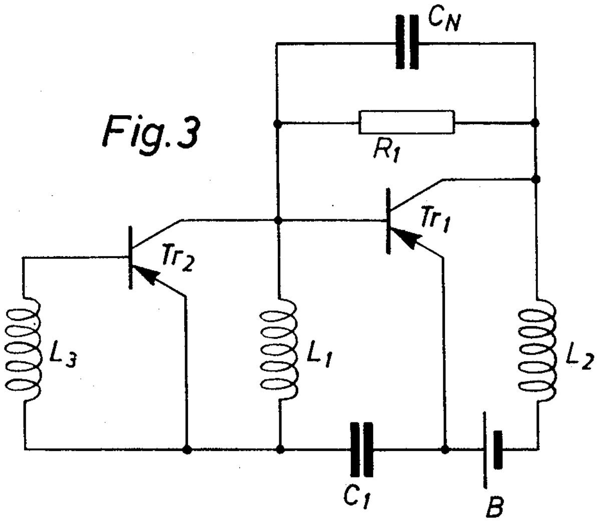
FIG. 3 shows a second example of a circuit arrangement according to the invention.

In the embodiment illustrated in FIG. 3, the condenser C1 in the input circuit of the main transistor *Tr*1 is in series connection with the control coil L1 and the collector and base of the transistor *Tr*1 are connected by the high ohmic resistance R1. This resistance R1 effects a charging of the condenser C1 when the oscillating element is at rest in such a manner that the transistor is given a base bias voltage which corresponds about to the input threshold value of the transistor. The transistor therefore becomes conductive very quickly and the oscillating element is driven at very small amplitudes. In operation the condenser C1 is reverse charged by the voltage induced in the control coil L1 so that the base of the transistor *Tr*1 now receives a voltage below the threshold value, with the result that only the peaks of the control voltage produced in the control coil L1 cause the transistor *Tr*1 to become conductive. On this account short steep flanked driving impulses are produced which occur chiefly only during the passing of the oscillating element through its position of rest. $C_N$ is a neutralizing condenser.

Figure 5:
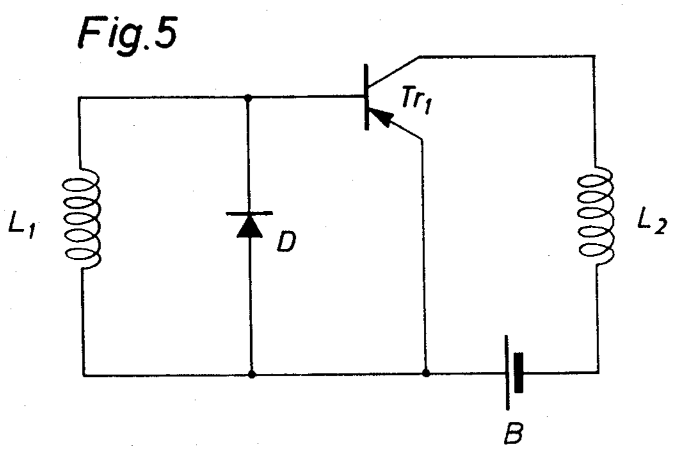
FIG. 5 is another embodiment of the circuit arrangement according to the invention.

In FIG. 5 a circuit arrangement is shown in which a diode D is provided as controllable resistance. This diode D has a steep drop in its forward resistance above a voltage which is greater than the input threshold value of the transistor *Tr*1. If the voltage induced in the control coil L1 attains at a certain amplitude of oscillation of the oscillating element the threshold value of the diode D, a portion of the control current induced in the control coil L commences to flow over the diode D so that a further increase in the control voltage is avoided and consequently an increase in the driving energy prevented.

Figure 6:
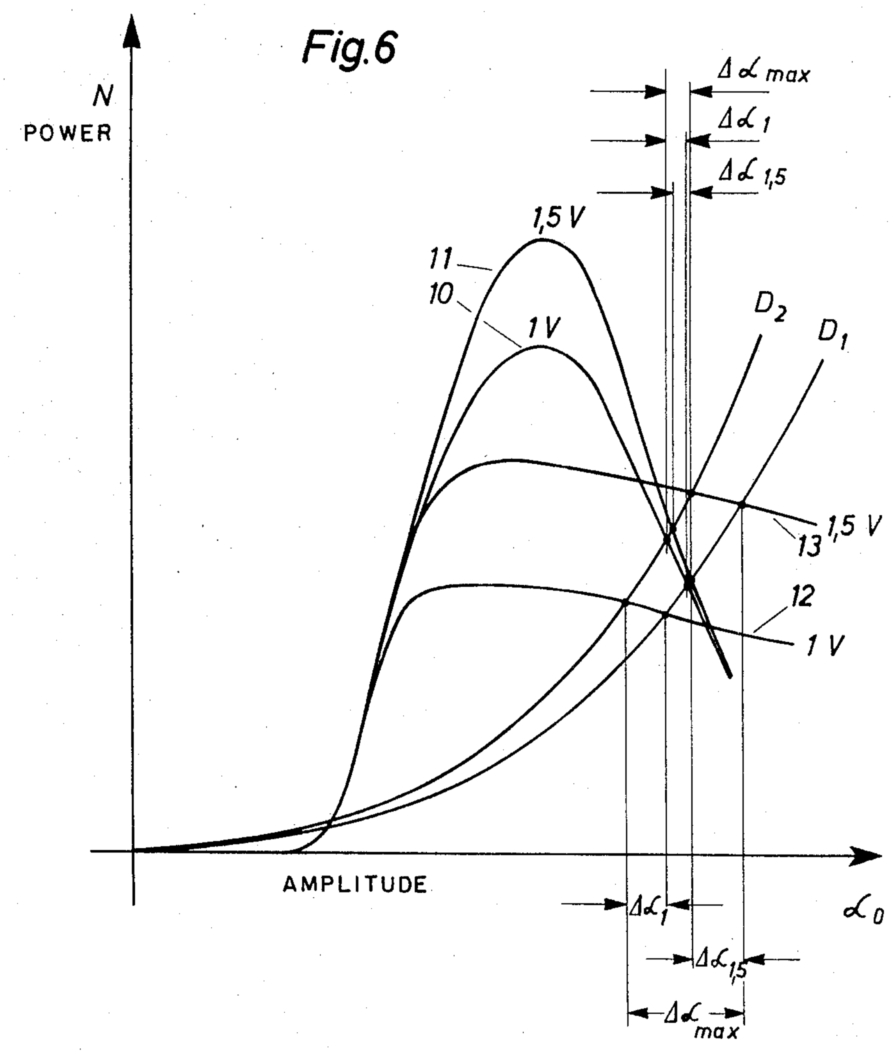
FIG. 6 is a diagram for explaining the regulating effect.

FIG. 6 shows the regulating effect. $D_1$ and $D_2$ represent the power required by the balance wheel and the efficiency under different attenuation in dependency upon amplitude $\alpha_0$. The other curves (10, 11, 12, 13) show the power supplied depending upon $\alpha_0$ at different voltages, namely stabilized according to the invention (10,

11), and without stabilizing measures (12, 13). The points of intersection of these curves with $D_1$ and $D_2$ indicate the amplitude actually being assumed. The diagram shows that the arrangement is chiefly suitable for voltage stabilization; it can however also compensate for "fluctuations in load" within certain limits. The amplitude changes at different voltage levels 1 v., 1.5 v., etc. are shown by the notation $\Delta\alpha_1$, etc.

What is claimed is:

1. In an oscillator comprising a semiconductor amplifier the output of which is connected to a driving coil for coupling energy to a mechanical oscillating element, which driving coil is coupled back to the input of said amplifier through a control coil, the improvement comprising a controllable resistance connected in parallel with said control coil, said resistance being responsive to the amplitude of oscillation such that its resistance varies to keep said amplitude constant.

2. The oscillator according to claim 1 including an additional regulating coil coupled to said oscillating element, wherein said controllable resistance is a silicon transistor having a control electrode connected to said regulating coil.

3. The oscillator according to claim 1, wherein the controllable resistance consists of a diode connected in parallel with said control coil, said diode having as steep a drop as possible in the forward resistance above a voltage which is greater than the input threshold value for said amplifier, and said diode being connected in such polarity that a portion of the current induced in said control coil flows through the diode in its forward direction when the voltage in said coil exceeds said threshold voltage.

References Cited by the Examiner

UNITED STATES PATENTS 3,100,278 8/1963 Reich ............ 58—23 X

FOREIGN PATENTS 350,252 12/1960 Switzerland.

NATHAN KAUFMAN, *Primary Examiner.*

ROY LAKE, *Examiner.*

S. H. GRIMM, *Assistant Examiner.*